United States Patent [19]

Inoue et al.

[11] 4,322,651
[45] Mar. 30, 1982

[54] ACOUSTIC SURFACE WAVE DEVICE

[75] Inventors: Atsushi Inoue; Hiromichi Yamada; Kenji Suzuki, all of Nagaokakyo, Japan

[73] Assignee: Murata Manufacturing Co., Ltd., Kyoto, Japan

[21] Appl. No.: 900,742

[22] Filed: Apr. 27, 1978

[30] Foreign Application Priority Data

May 9, 1977 [JP] Japan ................................. 52-53613
May 20, 1977 [JP] Japan ................................. 52-59011

[51] Int. Cl.³ ............................................. H01L 41/08
[52] U.S. Cl. ............................ 310/313 B; 310/313 C; 310/326
[58] Field of Search ................ 310/313, 326, 327; 333/150, 151, 153, 193, 194, 195

[56] References Cited

U.S. PATENT DOCUMENTS 4,034,318 7/1977 Ishiyama ........................ 310/313 X
4,090,153 5/1978 Toda et al. ..................... 310/313 X
4,096,455 6/1978 Drummond ..................... 310/313 X
4,139,791 2/1979 Yamada et al. .................. 310/313

Primary Examiner—Mark O. Budd
Attorney, Agent, or Firm—Birch, Stewart, Kolasch & Birch

[57] ABSTRACT

An acoustic surface wave device comprises transducers including interdigital electrodes formed on the surface of a piezoelectric material substrate of ceramic such as PZT, or a single crystal of such as LiNbO₃ or a piezoelectric thin film of such as ZnO, wherein an electrical signal is converted into an acoustic surface wave and vice versa. The interdigital electrodes have been changed of the overlapping lengths of the adjacent electrode fingers that are overlapped with each other in accordance with a weighting function determined by a desired pass characteristic. A portion of the transducer region where an undesired acoustic surface wave is propagated, i.e. the portion outside of the envelope of the interdigital electrodes determined by the weighting function, is provided with an acoustic surface wave absorbing material such as silicon rubber. In a certain example, dummy electrodes may be provided between the electrode fingers of the interdigital electrodes.

13 Claims, 11 Drawing Figures

ACOUSTIC SURFACE WAVE DEVICE

BACKGROUND OF THE INVENTION

1. Field of the Invention

The present invention relates to an acoustic surface wave device. More specifically, the present invention relates to an acoustic surface wave device including a combination of a piezoelectric material substrate and interdigitated electrodes formed thereon, wherein an electrical signal is converted into an acoustic surface wave and vice versa.

2. Description of the Prior Art

Referring to FIG. 1, there is shown a schematic diagram of a typical prior art acoustic surface wave device 100, which comprises a transducer 20 including a piezoelectric material substrate 10 of piezoelectric ceramic of such as PZT, a single crystal of such as LiNbO$_3$, or a piezoelectric thin film of such as ZnO and an interdigital electrode 21 operatively coupled to the piezoelectric material substrate 10 and including a pair of groups of electrode fingers 22b, ... 22b and 23b, ... 23b formed on the surface of the piezoelectric material substrate 10 in an interdigitated manner and adapted to be in the same potential by means of a pair of common electrodes 22a and 23a. Typically, such acoustic surface wave device is structured such that the electrode fingers have been changed of the overlapping lengths of the adjacent electrode fingers that are overlapped with each other in the longitudinal direction of the electrode fingers in accordance with the predetermined weighting function for the purpose of achieving a desired pass characteristic. However, the velocity of the acoustic surface wave propagated along the piezoelectric material substrate is different between a region where the electrode fingers are more dominant and a region where the electrode fingers are less dominant, or a more weighted region and a less weighted region. Accordingly, in an acoustic surface wave device having the so called weighted interdigital electrodes, the velocity distribution of the acoustic surface wave becomes uneven in the plane orthogonal to the propagation direction of the acoustic surface wave, which gives rise to a phase difference at the output side of the acoustic surface wave device. Therefore, even the so called weighted acoustic surface wave device suffers from a disadvantage that a predetermined desired pass characteristic cannot be achieved.

Another prior art acoustic surface wave device of interest that eliminates the above described disadvantage to some extent is disclosed in U.S. Pat. No. 3,699,364, issued Oct. 17, 1972 to Henry M. Gerard and assigned to Hughes Aircraft Company, wherein dummy electrodes 231, ... 231 and 221, ... 221 are provided between the adjacent electrode fingers 22b, ... 22b and 23b, ... 23b in the non-weighted region in order to make uniform the distribution of the velocity of the acoustic surface wave. Provision of such dummy electrodes eliminates the difference in the velocity of the acoustic surface wave between the weighted region and the non-weighted region, resulting in a decreased phase difference at the output side of the acoustic surface wave device. However, provision of such dummy electrodes conversely increases an electrically and mechanically reflected wave of the acoustic surface wave, and as a result another problem is encountered wherein an undesired response, i.e. a ripple occuring in the pass band and the ripple of the group delay characteristic increase, as shown in FIG. 3 which shows a pass characteristic of a prior art acoustic surface wave device, the ordinate indicating the attenuation amount and the abscissa indicating the frequency of the acoustic surface wave.

In order to decrease an electrically reflected wave, it was proposed that dummy electrodes 211, ... 221 and 231, ... 231 are also coupled to the common electrodes 22a and 23a connecting the respective electrode fingers 22b, ... 22b and 23b, ... 23b to the same potential, as shown in FIG. 2, whereby the dummy electrodes are brought to the same potential as that of the adjacent electrode fingers. However, even in such an acoustic surface wave device wherein the dummy electrodes have been brought to the same potential as that of the adjacent electrode fingers, the above described ripple by virtue of a mechanically reflected wave is not improved at all. On the other hand, in fabricating such acoustic surface wave device, a piezoelectric material substrate of a larger electrical/mechanical coupling coefficient Keff with respect to the acoustic surface wave is employed for the purpose of improving the conversion efficiency. Since the above described mechanically reflected wave becomes larger in approximate proportion to a square of the electrical/mechanical coupling coefficient Keff, the above described mechanically reflected wave abruptly increases as the electrical/mechanical coupling coefficient Keff becomes larger. As a result, the ripple in the pass band and the ripple of the group delay characteristic $(=-1/2\pi \, D\phi/Df$; where f is the frequency and $\phi$ is the phase) also abruptly increase with an increase in the electrical/mechanical coupling coefficient Keff, as shown by the dotted line in FIGS. 4 and 5, which will be described in more detail subsequently.

SUMMARY OF THE INVENTION

Briefly described, the inventive acoustic surface wave device comprises a transducer for converting an electrical signal into an acoustic surface wave and vice versa through cooperation of a piezoelectrical material substrate and interdigital electrodes formed thereon, wherein the interdigital electrodes have been weighted of the overlapping lengthes of the adjacent electrode fingers that are overlapped with each other in the longitudinal direction of the electrode fingers in accordance with a predetermined weighting function, whereby a weighted region and a non-weighted region is defined by an envelope of the weighted electrode fingers and the non-weighted region is provided with an acoustic surface wave absorbing material for damping undesired acoustic surface wave.

Accordingly, a principal object of the present invention is to provide an acoustic surface wave device, wherein propagation of an undesired acoustic surface wave is eliminated.

Another object of the present invention is to provide an acoustic surface wave device, wherein an undesired reflected wave is eliminated.

A further object of the present invention is to provide an acoustic surface wave device, wherein the frequency characteristic is improved.

Still a further object of the present invention is to provide an acoustic surface wave device, wherein the group delay characteristic is improved.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 6A:
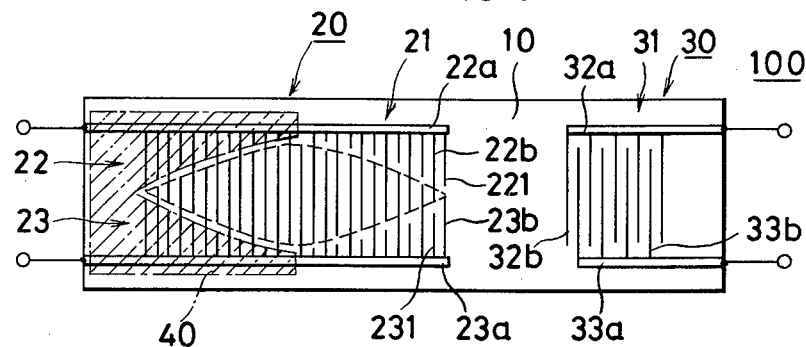
FIG. 6A shows a diagrammatic view of one embodiment of the present invention.
Figure 6B:
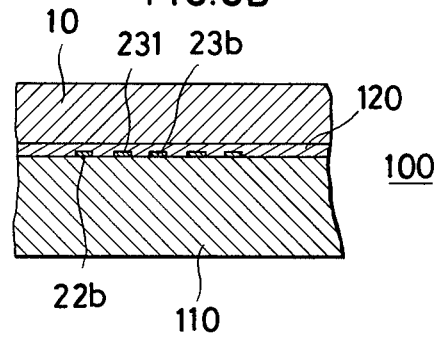
FIG. 6B shows a sectional enlarged view of a portion of the inventive device.

FIG. 6A shows a diagrammatic view of one embodiment of the present invention and FIG. 6B shows an enlarged sectional view of the FIG. 6A embodiment. The acoustic surface wave device is generally denoted by the reference numeral 100. The acoustic surface wave device 100 comprises a piezoelectric material substrate 10. The piezoelectric material substrate 10 may be a plate of piezoelectric ceramic such as PZT, a single crystal of such as LiNbO$_3$, or a piezoelectric film of such as ZnO. The embodiment is shown as comprising a piezoelectric thin film of such as ZnO. The acoustic surface wave device 100 further comprises an input side transducer 20 and an output side transducer 30 coupled to the input side transducer 20. The input side transducer 20 comprises a cooperative combination of the piezoelectric material substrate 10 and an interdigital electrode 21. In case where the piezoelectric material substrate 10 is a plate of piezoelectric ceramic or a single crystal, the interdigital electrode 21 is formed on the piezoelectric material substrate 10. However, in case of a piezoelectric thin film of ZnO as in case of the embodiment shown, the interdigital electrode 21 is formed on a substrate 110 of such as glass and an insulating film 120 is further formed thereon, whereupon a piezoelectric thin film serving as a piezoelectric material substrate 10 is formed on the insulating film 120, whereby a layered structure as shown is provided. However, it is pointed out that FIG. 6A shows a diagrammatic view of any other embodiment of a different structure as well as the FIG. 6B embodiment.

The interdigital electrode 21 comprises a pair of comb shaped electrodes 22 and 23 disposed to be interdigitated. The comb shaped electrode 22 comprises a common electrode 22a and a plurality of electrode fingers 22b, 22b, . . . connected to the common electrode 22a. Similarly, the comb shaped electrode 23 also comprises a common electrode 23a and a plurality of electrode fingers 23b, 23b, . . . connected to the common electrode 23a. The comb shaped electrodes 22 and 23 of such interdigital electrode 21 can be formed in accordance with a well known pattern technology employing a sputtering, ion plating, evaporation, photoetching, beam etching or chemical etching process by the use of a metallic material of such as aluminum, silver, gold or the like.

The output side transducer 30 also comprises an interdigital electrode 31. The interdigital electrode 31 comprises a pair of comb shaped electrodes 32 and 33 disposed to be interdigitated. The comb shaped electrodes 32 and 33 comprise common electrodes 32a and a plurality of electrode fingers 32b, 32b, . . . connected thereto and a common electrode 33a and a plurality of electrode fingers 33b, 33b, . . . connected thereto, respectively.

The FIG. 6A embodiment is configured such that the input side interdigital electrode 21 is weighted. The weighting is achieved by changing the overlapping lengths of the adjacent electrode fingers in the longitudinal direction of the electrode fingers, i.e. in the direction orthogonal to the acoustic propagation direction with respect to the comb shaped electrodes 22 and 23 of the interdigital electrode in accordance with a predetermined weighting function determinable based on the pass characteristic required for the acoustic surface wave device 100. In other words, the envelope of the tip ends of the electrodes fingers 22b, . . . 22b and 23b, . . . 23b of the respective comb shaped electrodes 22 and 23 is adapted to be consistent with the above described weighting function. The embodiment shown further comprises dummy electrodes 221 and 231 extending along the extensions of the respective electrode fingers 22b and 23b from the common electrode 23a and 22a of the other comb shaped electrode 23 and 22 not belonging to the said finger 22b and 23b to an appropriate position spaced apart from the said finger 22b and 23b, respectively.

An essential feature of the present invention resides in an acoustic surface wave absorbing material 40. More specifically, according to the present invention, an acoustic surface wave absorbing material 40 is provided for the purpose of absorbing an undesired reflected wave ocurring by virtue of the dummy electrodes 221 and 231 and the electrode finger 22b and 23b. The acoustic surface wave absorbing material 40 may be selected from a group consisting of silicon rubber, epoxy resin, a mixture of silicon rubber and epoxy resin, a mixture of silicon rubber and an oxide powder, a mixture of epoxy resin and an oxide powder, admixed with oxide powder, a mixture of silicon rubber, epoxy resin and an oxide powder, and wax. In other words, the above described acoustic surface wave absorbing material 40 is preferably a material of a larger viscosity, excellent adhesiveness and of larger density, which is likely to absorb the surface wave and is of a larger internal loss. From the standpoint of practical use, the acoustic surface wave absorbing material 40 is preferably a mixture of silicon rubber and an oxide powder or a mixture of silicon rubber, epoxy resin and an oxide powder. The acoustic surface wave absorbing material 40 is coated by means of a printing or a coating process on a transducer region of the input side transducer 20 where an undesired acoustic surface wave is propagated. The portion where an undesired acoustic surface wave is propagated is meant by a portion opposite side of the output side transducer 30 in the portion where the dummy electrodes 221 and 231 are provided, i.e. a non-weighted region, according to the embodiment shown. In case where the device 100 is structured as shown in FIG. 6B, the acoustic surface wave absorbing material 40 is formed on the piezoelectric material 10 of a piezoelectric thin film. In case where the device 100 employs piezoelectric ceramic or a single crystal, then the acoustic surface wave absorbing material may be formed directly on the electrode and the piezoelectric material, as shown in FIG. 6A.

Although the thickness of the acoustic surface wave absorbing material 40 may be changed properly depending on the kind of the material, in case of a practical television intermediate frequency filter, silicon rubber is preferably used with a thickness of more than 150 μm. (It is pointed out that the velocity of the acoustic surface wave is different depending on the density of the acoustic surface wave absorbing material 40.)

Figure 1:
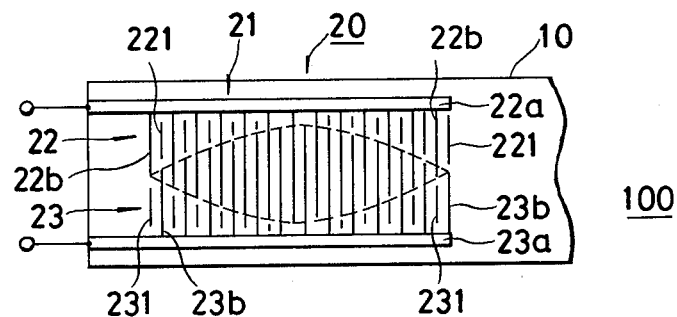
FIGS. 1 and 2 show schematic diagrams of different examples of prior art acoustic surface wave devices having dummy electrodes and constituting the background of the present invention.
Figure 2:
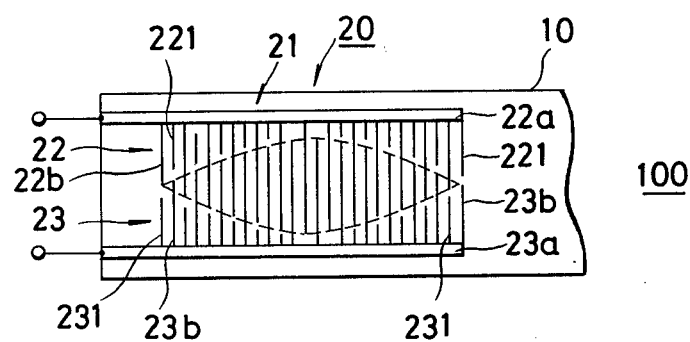
Figure 3:
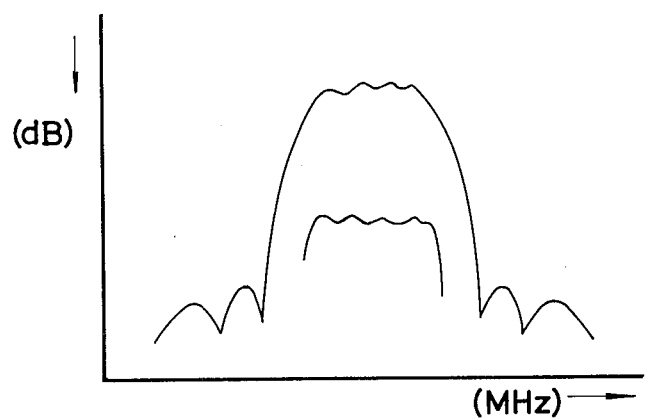
FIG. 3 is a graph showing the frequency characteristic of the conventional acoustic surface wave device having dummy electrodes and constituting the background of the present invention, wherein the abscissa indicates the frequency and the ordinate indicates the attenuation amount.
Figure 4:
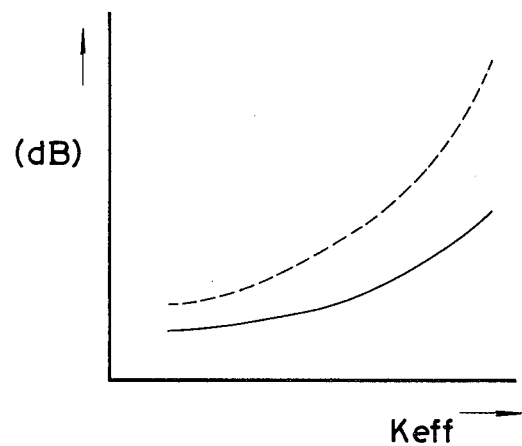
FIG. 4 is a graph showing the relation between the electrical/mechanical coupling coefficient Keff and the ripple in the pass band, wherein the dotted line curve shows the characteristic of the conventional device while the solid line curve shows the characteristic of the inventive device.
Figure 5:
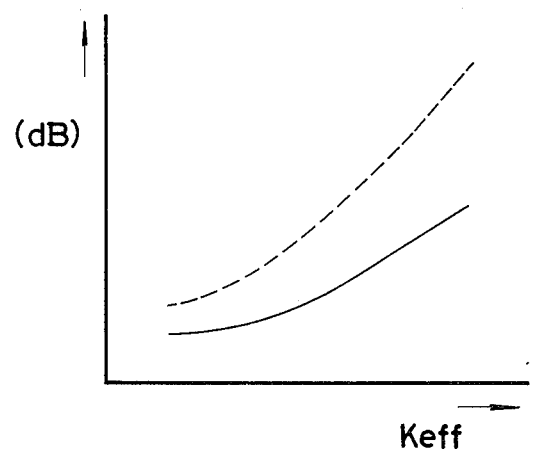
FIG. 5 is a graph showing the relation between the electrical/mechanical coupling coefficient Keff and the ripple of the group delay characteristic, wherein the dotted line curve shows the characteristic of the conventional device while the solid line curve shows the characteristic of the inventive device.
Figure 7:
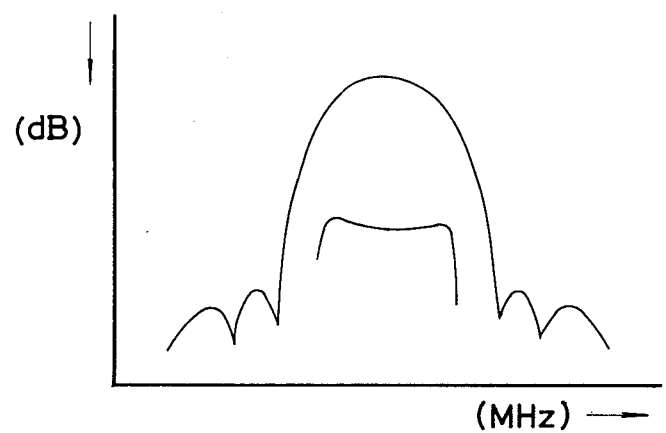
FIG. 7 is a graph showing the frequency characteristic for explaining the effect of the present invention, wherein the abscissa indicates the frequency and the ordinate indicates the attenuation amount.

It has been observed that provision of an acoustic surface wave absorbing material 40 on a region where an undesired acoustic surface wave is propagated considerably suppresses a surface wave propagating through an undesired portion out of the propagating surface wave. Therefore, according to the present invention, a mechanically reflected wave reflected from a portion of the electrode fingers and the dummy electrodes is effectively eliminated. Even if such a reflected wave occurs, the same is considerably reduced and a further reflected wave caused from the reflected wave is further suppressed by the acoustic surface wave absorbing material 40. As a result, the ripple in the pass band and the ripple in the group delay characteristic are considerably reduced, as shown in FIG. 7. Since a mechanically reflected wave is considerably reduced, the above described ripples do not abruptly increase, as the electrical/mechanical coupling coefficient Keff is increased, as shown by the solid line in FIGS. 4 and 5. Accordingly, the above described effect of the present invention is particularly conspicuous, when the material of an increased electrical/mechanical coupling coefficient Keff is employed.

Since in the above described embodiment the dummy electrodes 221 and 231 are provided, the velocity distribution of the acoustic surface wave in terms of the plane orthogonal to the propagation direction can be uniform. In addition, since the dummy electrodes 221 and 231 are coupled to the respective common electrodes 22a and 23a such that the adjacent electrode fingers 22b and 23b may be of the same electrical potential, electrical reflection can further be reduced.

Figure 8:
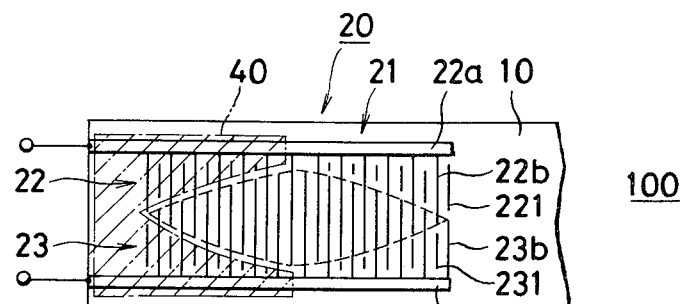
FIG. 8 is a diagrammatic view of another embodiment of the present invention.

FIG. 8 shows a diagrammatic view of another embodiment of the present invention. The FIG. 8 embodiment is different from the FIG. 6A embodiment in the following respect. More specifically, the dummy electrodes 221 and 231 are not connected to the common electrodes 22a and 23a. Accordingly, the dummy electrodes 221 and 231 are electrically isolated from the comb shaped electrodes 22 and 23.

Figure 9:
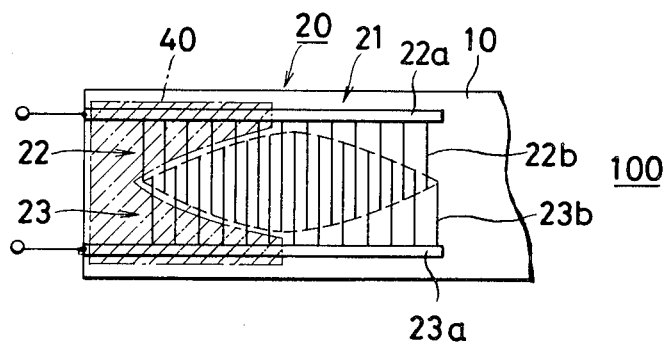
FIG. 9 is a diagrammatic view of a further embodiment of the present invention.

FIG. 9 shows a diagrammatic view of a further embodiment of the present invention. The FIG. 9 embodiment is different from the FIGS. 6A and 8 embodiments in that the FIG. 9 embodiment does not comprise dummy electrodes at all.

Figure 10:
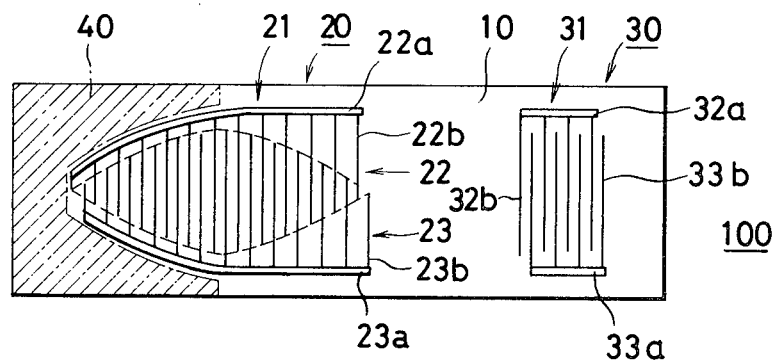
FIG. 10 is a diagrammatic view of still a further embodiment of the present invention.

FIG. 10 shows a diagrammatic view of still a further embodiment of the present invention. The FIG. 10 embodiment is different from the FIG. 6A embodiment in the following respect. More specifically, no dummy electrodes are provided and the common electrodes 22a and 23a for commonly connecting the electrode fingers 22b, . . . 22b and 23b, . . . 23b of the comb shaped electrodes 22 and 23 are configured in a curve similar to the envelope connecting the tip ends of the electrode fingers in a region of electrode fingers where an undesired acoustic surface wave is propagated. In other words, the common electrodes 22a and 23a are curved along the above described envelope from the position farthest spaced from one transducer 30 to the position where the electrode fingers start to become shorter. The acoustic surface wave absorbing material 40 is provided on the piezoelectric material 10 in the region outside of the transducer 20 from the above described common electrodes 22a and 23a. The acoustic surface wave material 40 is preferably provided to lie up to the end of the piezoelectric material 10. The output side transducer 30 also comprises a well known typical interdigital electrode 31 formed on the piezoelectric material, as similar to that in the FIG. 6A embodiment. According to the embodiment shown, an undesired wave out of the acoustic surface wave excited by the transducer 20 is not reflected by a superfluous portion of the electrode fingers or by the dummy electrodes of a conventional device, and in addition an undesired wave propagating toward the outside of the transducer 20 is absorbed by the acoustic surface wave absorbing material 40.

Since the other structure, function and effect of the embodiment shown in FIGS. 8, 9 and 10 are substantially the same as those discussed in conjunction with the FIG. 6A embodiment, it is not believed necessary to describe the same again.

Although in the foregoing the embodiments were described as including the electrode fingers 22b, . . . 22b and 23b, . . . 23b equally spaced apart from each other, it is needless to say that the invention can be practiced by changing the distance between the electrode fingers in accordance with a desired pass characteristic. It is further pointed out that the acoustic surface wave absorbing material may be provided not only in association with the input side transducer 20, as shown in the above described embodiments, but also in association with the output side transducer 30. It is further pointed out that the present invention can be practiced in combination of any of the above described embodiments.

Although the present invention has been described and illustrated in detail, it is to be clearly understood that the same is by way of limitation, the spirit and scope of the present invention being limited only by the terms of the appended claims.

What is claimed is:

1. An acoustic surface wave device, comprising:
   a piezoelectric material adapted for supporting propagating acoustic surface wave energy;
   at least one electromechanical transducer means for converting an electrical signal into an acoustic surface wave and vice versa, coupled to a surface of said piezoelectric substrate at a transducer region thereof, said transducer means comprising an interdigital electrode assembly including first and second common electrodes and first and second groups of electrode fingers commonly connected respectively to said common electrodes at one end thereof and extending toward the other said common electrode to terminate in a free end;

said electrode fingers of said first and second groups having respectively overlapping lengths which vary to form an envelope of a desired shape defined by said free ends of said electrode fingers; and an acoustic surface wave absorbing material provided on said piezoelectric material in an area including a portion of said transducer region where an undesired acoustic surface wave is propogated, edge portions of said acoustic surface wave absorbing material adjacent said envelope being conformally configured therewith.

2. An acoustic surface wave device in accordance with claim 1, wherein said acoustic surface wave absorbing material is a good absorber of acoustic surface waves and has large internal losses.

3. An acoustic surface wave device in accordance with claim 2, wherein said acoustic surface wave material is selected from the group consisting of silicon rubber, epoxy resin, a mixture of silicon rubber and epoxy resin, a mixture of silicon rubber and an oxide powder, a mixture of epoxy resin and an oxide powder, a mixture of silicon rubber, epoxy resin and an oxide powder and wax.

4. An acoustic surface wave device in accordance with claim 1, wherein said interdigital electrode assembly further includes dummy electrodes positioned colinearly with said electrode fingers on said piezoelectric material and electrically isolated from said electrode fingers.

5. An acoustic surface wave device in accordance with claim 4, wherein each of said dummy electrodes positioned colinearly with a said electrode finger is connected to said common electrode opposite to the common electrode corresponding to that electrode finger.

6. An acoustic surface wave device in accordance with claim 4, wherein said dummy electrodes positioned colinearly with said electrode fingers are electrically isolated from all of the other of said electrode fingers which are commonly connected.

7. An acoustic surface wave device in accordance with claim 1, wherein said first and second common electrodes of said interdigital electrode assembly are conformally configured to said envelope in that area of said envelope corresponding to said transducer region where an undesired acoustic surface wave is propagated.

8. An acoustic surface wave device, comprising:
a piezoelectric material adapted for supporting propagating acoustic wave energy;
at least one electromechanical transducer means for converting an electric signal into an acoustic surface wave and vice versa, coupled to a surface of said piezoelectric substrate at a transducer region thereof, said transducer means comprising an interdigital electrode assembly including a first and second common electrodes and first and second groups of electrode fingers commonly connected, respectively, to said common electrodes;

said electrode fingers of said first and second groups having overlapping lengths which vary to form an envelope of a desired shape defining by said overlapping lengths of said electrode fingers; and an acoustic surface wave absorbing material provided on said piezoelectric material in an area including a portion of said transducer region where an undesired acoustic surface wave is propagated;

said common electrodes of said interdigital electrode assembly being substantially conformally configured with said envelope in that portion of said transducer region included in the area of said piezoelectric material where an undesired acoustic surface wave is propagated.

9. The acoustic surface wave device of claim 8, wherein said acoustic wave absorbing material is positioned on said piezoelectric material so that an edge of said acoustic surface wave absorbing material adjacent said envelope is substantially conformally configured therewith.

10. The acoustic surface wave device of claim 9, wherein said common electrodes are outboard of said envelope and the substantially conformally configured edge of said acoustic wave absorbing material is outboard of said common electrodes.

11. The acoustic surface wave device of claims 1, 7, 8, 9 or 10 further comprising:
output transducer means mounted on said piezoelectric material for receiving acoustic surface waves emitted from said electromechanical transducer means; and
wherein the area of said piezoelectric material where an undesired acoustic surface wave is propagated is at the opposite extreme of said electromechanical transducer means from said output transducer means.

12. An acoustic surface wave device in accordance with claims 8, 9 and 10, wherein said interdigital electrode assembly further includes dummy electrodes positioned colinearly with said electrode fingers on said piezoelectric material and electrically isolated from said electrode fingers;
each of said dummy electrodes positioned colinearly with a said electrode finger being connected to said common electrode opposite to the said common electrode corresponding to that electrode finger.

13. An acoustic surface wave device in accordance with claims 8, 9 and 10, wherein said interdigital electrode assembly further includes dummy electrodes positioned colinearly with said electrode fingers on said piezoelectric material and electrically isolated from said electrode fingers;
each of said dummy electrodes positioned colinearly with a said electrode finger being connected to said common electrode opposite to the said common electrode corresponding to that electrode finger;
wherein said acoustic surface wave device further comprises:
output transducer means mounted on said piezoelectric material for receiving acoustic surface waved emitted from said electromechanical transducer means; and
wherein the area of said piezoelectric material where an undesired acoustic surface wave is propagated is at the opposite extreme of said electromechanical transducer means from said output transducer means.

* * * * *